(12) United States Patent
Peng et al.

(10) Patent No.: US 10,290,634 B2
(45) Date of Patent: May 14, 2019

(54) MULTIPLE THRESHOLD VOLTAGES USING FIN PITCH AND PROFILE

(71) Applicant: GLOBALFOUNDRIES Inc., Grand Cayman (KY)

(72) Inventors: Wen Pin Peng, Clifton Park, NY (US); Min-hwa Chi, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 80 days.

(21) Appl. No.: 15/001,903

(22) Filed: Jan. 20, 2016

(65) Prior Publication Data

US 2017/0207216 A1 Jul. 20, 2017

(51) Int. Cl.
| | |
|---|---|
| *H01L 27/088* | (2006.01) |
| *H01L 29/06* | (2006.01) |
| *H01L 21/306* | (2006.01) |
| *H01L 21/8234* | (2006.01) |

(52) U.S. Cl.
CPC .... *H01L 27/0886* (2013.01); *H01L 21/30604* (2013.01); *H01L 21/823431* (2013.01); *H01L 29/0657* (2013.01)

(58) Field of Classification Search
None
See application file for complete search history.

(56) References Cited

U.S. PATENT DOCUMENTS

| | | | |
|---|---|---|---|
| 7,301,210 B2 | 11/2007 | Abadeer et al. | |
| 8,878,298 B2 | 11/2014 | Chang et al. | |
| 9,368,388 B2 * | 6/2016 | Liaw | H01L 27/1104 |
| 9,418,994 B1 * | 8/2016 | Chao | H01L 27/0886 |
| 2013/0126978 A1 * | 5/2013 | Becker | H01L 27/092 257/369 |
| 2013/0270559 A1 * | 10/2013 | Hafez | H01L 27/11206 257/50 |
| 2014/0065802 A1 * | 3/2014 | Chang | H01L 21/845 438/479 |
| 2014/0131813 A1 * | 5/2014 | Liaw | H01L 27/1104 257/401 |
| 2014/0191325 A1 * | 7/2014 | Chowdhury | H01L 27/0924 257/369 |
| 2015/0228743 A1 * | 8/2015 | Wann | H01L 21/823431 257/401 |

(Continued)

OTHER PUBLICATIONS

Akarvardar, et al., "Performance and Variability in Multi-VT FinFETs Using Fin Doping," Symposium on VLSI Technology, 2012.

(Continued)

*Primary Examiner* — Walter H Swanson
*Assistant Examiner* — Kien C Ly
(74) *Attorney, Agent, or Firm* — Thompson Hine LLP; Francois Pagette

(57) ABSTRACT

A multi-Vt FinFET includes a semiconductor substrate, multiple first fins coupled to the semiconductor substrate having a first fin pitch, and multiple second fins coupled to the semiconductor substrate having a second fin pitch larger than the first fin pitch. The semiconductor structure further includes transistor(s) on the multiple first fins, and transistor(s) on the multiple second fins, a threshold voltage of the transistor(s) on the multiple second fins being higher than that of the transistor(s) on the multiple first fins.

9 Claims, 4 Drawing Sheets

(56) References Cited

U.S. PATENT DOCUMENTS

2015/0340471 A1* 11/2015 Lim .................. H01L 29/66795
   438/283
2017/0005090 A1* 1/2017 Ando .................. H01L 27/0886
2017/0084616 A1* 3/2017 Kim .................... H01L 27/1104

OTHER PUBLICATIONS

Han, et al., "FinFET Multi-Vt Tuning with Metal Gate WF Modulation by Plasma Doping," International Workshop Junction Technology, IWJT, paper S6_04, 2014.

* cited by examiner

MULTIPLE THRESHOLD VOLTAGES USING FIN PITCH AND PROFILE

BACKGROUND OF THE INVENTION

Technical Field

The present invention generally relates to semiconductor fabrication. More particularly, the present invention relates to co-fabrication of FinFETs having multiple different threshold voltages.

Background Information

In modern FinFET-based semiconductor fabrication, different threshold (turn-on) voltages (Vt) for co-fabricated FinFETs are achieved using a variety of methods, including, for example, channel doping or using one or more work function gate electrode materials. However, each of these known methods have their own drawbacks, including, for example, requiring precise control, process complexity, yield degradation, or the inability to scale downwardly.

Thus, a need continues to exist for achieving multi-Vt that is relatively simple and downwardly scalable.

SUMMARY OF THE INVENTION

The shortcomings of the prior art are overcome and additional advantages are provided through the provision, in one aspect, of a method of co-fabricating multi-Vt FinFETs. The method includes providing a semiconductor substrate. The method further includes, in a FinFET fabrication process, forming at least two first fins adjacent each other and coupled to the semiconductor substrate, the at least two first fins having a first fin pitch, and forming at least two second fins adjacent each other and coupled to the semiconductor substrate, the at least two second fins having a second fin pitch larger than the first fin pitch. The method further includes, in the FinFET fabrication process, forming a trench of isolation material between the at least two first fins and the at least two second fins, surrounding bottom portions of the at least two first fins and the at least two second fins with isolation material, exposed portions of the at least two first fins and the at least two second fins being active, and the at least two second fins at the exposed portions thereof having a larger slope than that of the exposed portions of the at least two first fins at a corresponding exposed portion thereof, such that a widest width of the at least two second fins is at a bottom of the exposed portions thereof.

In accordance with another aspect, a semiconductor structure is provided. The semiconductor structure includes a semiconductor substrate, at least two first fins adjacent each other and coupled to the semiconductor substrate, the at least two first fins having a first fin pitch, and at least two second fins adjacent each other and coupled to the semiconductor substrate, the at least two second fins having a second fin pitch larger than the first fin pitch. The semiconductor structure further includes isolation material in a trench separating the at least two first fins from the at least two second fins and surrounding a bottom portion of the at least two first fins and the at least two second fins, exposed portions of the at least two first fins and the at least two second fins being active, and the at least two second fins at the exposed portions thereof each having a single continuous slope extending to a top surface thereof, the single slope being larger than that of the exposed portions of the at least two first fins at a corresponding exposed portion thereof, such that a widest width of the at least two second fins is at a bottom of the exposed portions thereof.

These, and other objects, features and advantages of this invention will become apparent from the following detailed description of the various aspects of the invention taken in conjunction with the accompanying drawings.

DETAILED DESCRIPTION OF THE INVENTION

Figure 1:
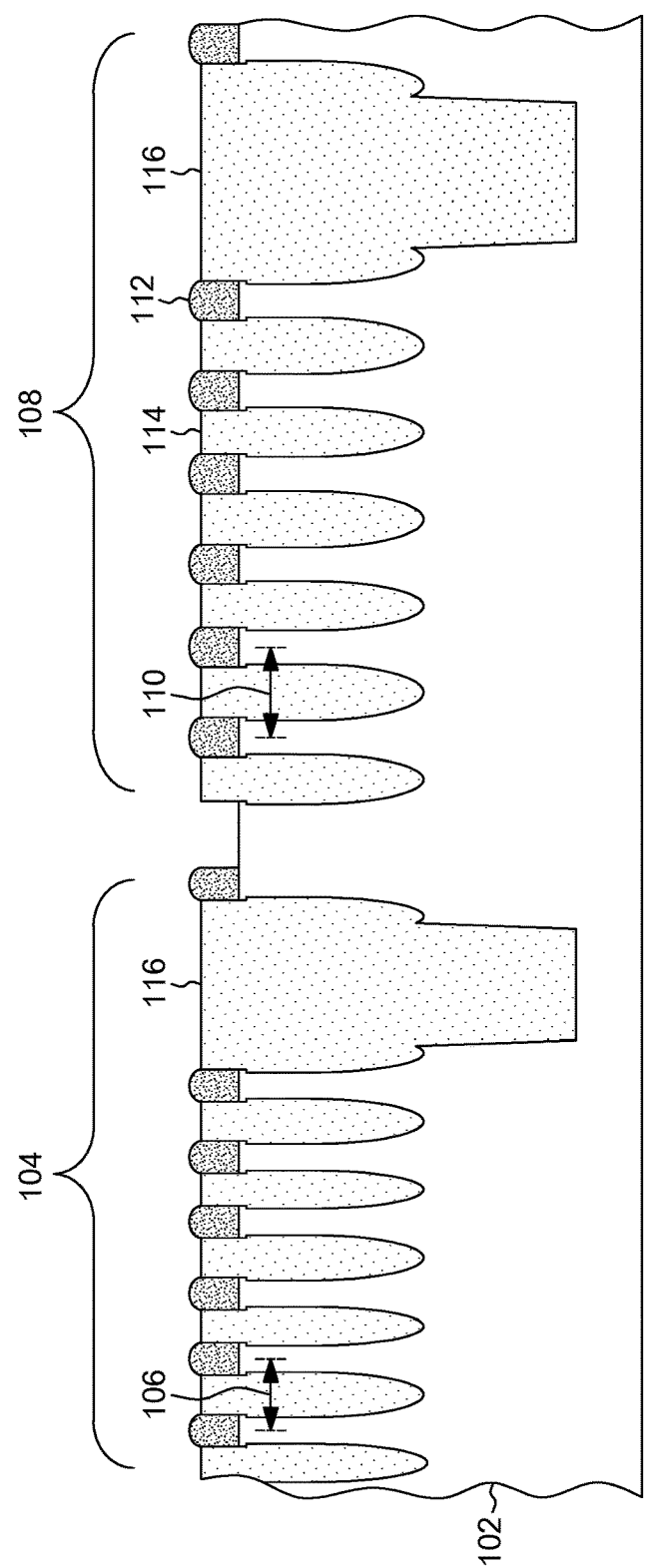
FIG. 1 is a cross-sectional view of one example of a semiconductor structure 100, the semiconductor structure including a semiconductor substrate, a first group of fins coupled to the substrate having a first fin pitch, a second group of fins coupled to the substrate having a second fin pitch larger than the first fin pitch, each fin having a hard mask cap, spaces between fins being filled with a dielectric material, and the fin groups being electrically isolated by relatively large/deep trenches filled with isolation material, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

As used herein, unless otherwise specified, the term "about" used with a value, such as measurement, size, etc., means a possible variation of plus or minus five percent of the value. Also, unless otherwise specified, a given aspect of semiconductor fabrication described herein may be accomplished using conventional processes and techniques, where part of a method, and may include conventional materials appropriate for the circumstances, where a semiconductor structure is described.

Reference is made below to the drawings, which are not drawn to scale for ease of understanding, wherein the same reference numbers are used throughout different figures to designate the same or similar components.

FIG. 1 is a cross-sectional view one example of a semiconductor structure 100, the semiconductor structure including a semiconductor substrate 102, a first group of fins 104 coupled to the substrate having a first fin pitch 106, a second group of fins 108 coupled to the substrate having a second fin pitch 110 larger than the first fin pitch, each fin having a hard mask cap (e.g., hard mask cap 112), spaces between fins being filled with a dielectric material 114, and the fin groups being electrically isolated by relatively large/deep trenches filled with isolation material 116, in accordance with one or more aspects of the present invention.

The starting structure may be conventionally fabricated, for example, using known processes and techniques. Further, unless noted otherwise, conventional processes and techniques may be used to achieve individual steps of the fabrication process of the present invention. However, although only a portion is shown for simplicity, it will be understood that, in practice, many such structures are typically included on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The fins may, for example, be etched from a bulk substrate, and may include, for example, any of the materials listed above with respect to the substrate. Further, some or all of the fins may include added impurities (e.g., by doping), making them n-type or p-type. The level of taperness of fin profile can be tuned during fin formation by tuning silicon etching parameters (e.g. flow, species of C and F content, pressure, and temperature, . . . etc.) as known to those in the field.

Figure 2:
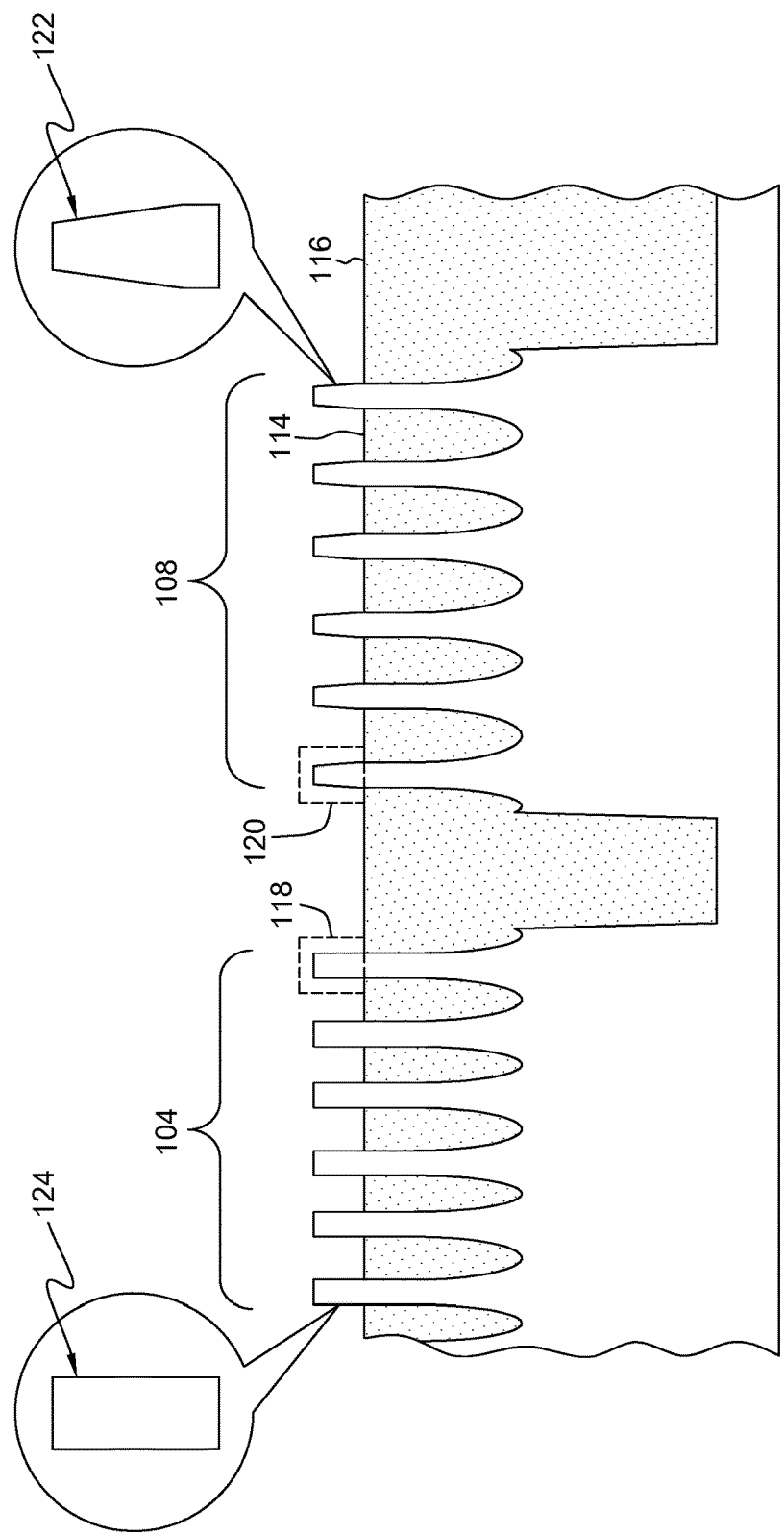
FIG. 2 depicts one example of the structure of FIG. 1 after removal of the hard mask caps and recessing of the dielectric material and the isolation material, exposing active areas of the fins, the recessing being, for example, a common recess by plasma etching, and resulting in active areas of the second group of fins having a more tapered profile in comparison, while active areas of the first group of fins have a more vertical profile in comparison, in accordance with one or more aspects of the present invention.

FIG. 2 depicts one example of the structure of FIG. 1 after removal of the hard mask caps (112, FIG. 1) and recessing of the dielectric material 114 and the isolation material 116, exposing active areas (e.g., active areas 118 and 120) of the fins, the recessing being, for example, a common recess by plasma etching, and resulting in active areas of the second group of fins 108 having a tapered profile (e.g., tapered profile 122), while active areas of the first group of fins 104 have a more vertical profile in comparison (e.g., profile 124), in accordance with one or more aspects of the present invention. The level of taperness of fin profile can also be tuned during dielectric recess etching by tuning parameters (e.g. flow, species of C and F content, pressure, and temperature, . . . etc.) as known to those in field. Note that the final fin profile difference between fin groups 104 and 108 is mainly determined by the combined etching steps at Si recess (during fin formation) and dielectric etching (for revealing the active fin height). The differences in fin pitch between groups 104 and 108 provides fundamental margin for tuning the fin profile differences and eventually leading to tuning Vt differences. Similarly, if more than 2 groups of fin pitch designed by layout, then there can be circuits with multiple Vt resulted.

Figure 3:
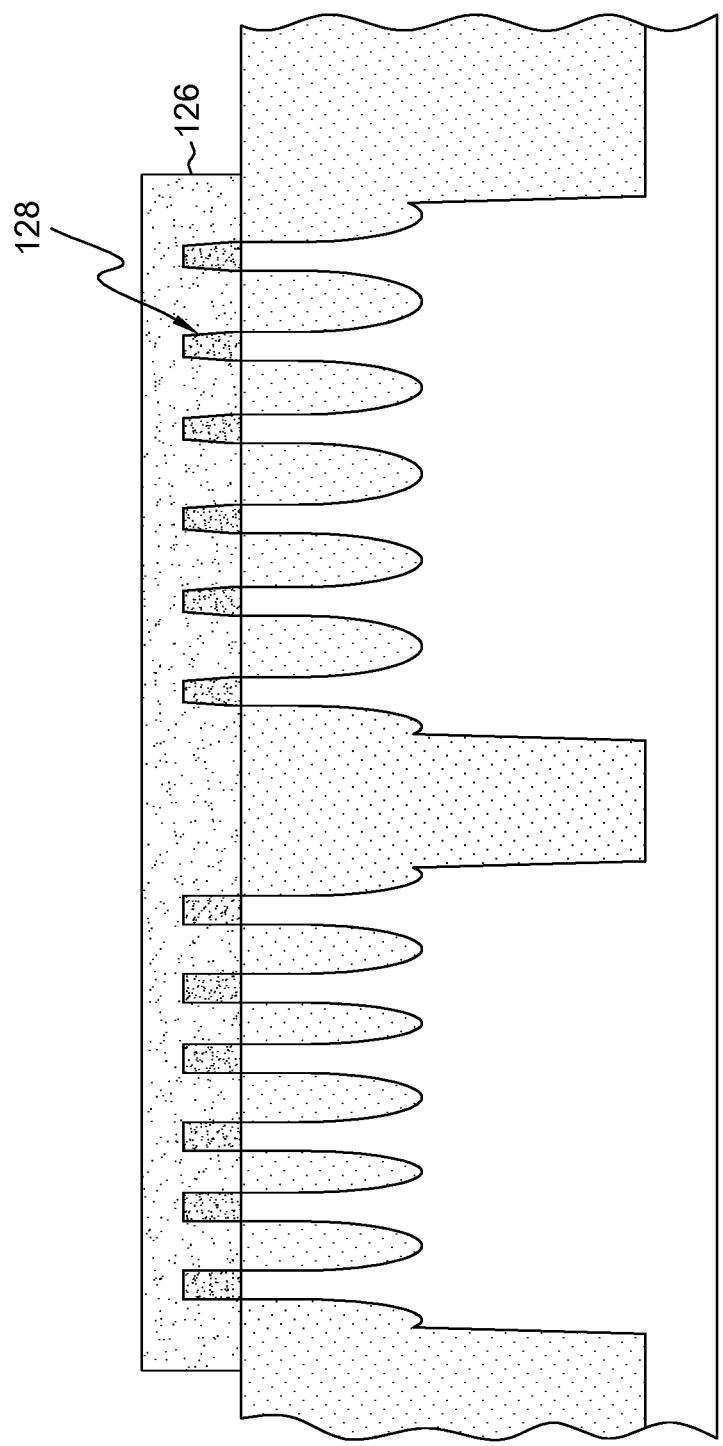
FIG. 3 depicts one example of the structure of FIG. 2 after source and drain formation (not visible in this cross-section) and a gate electrode is formed and planarized, encompassing channel regions of the active areas, in accordance with one or more aspects of the present invention.

FIG. 3 depicts one example of the structure of FIG. 2 after source and drain formation (not visible in this cross-section) and a gate electrode stack 126 is formed, encompassing channel regions (e.g., channel region 128) of the active areas for both fin groups 104 and 108, in accordance with one or more aspects of the present invention. The electrode stack 126 includes gate dielectric layers, a capping layer, one or more work-function layers, and metal electrode layers (not shown here for simplicity).

Figure 4:
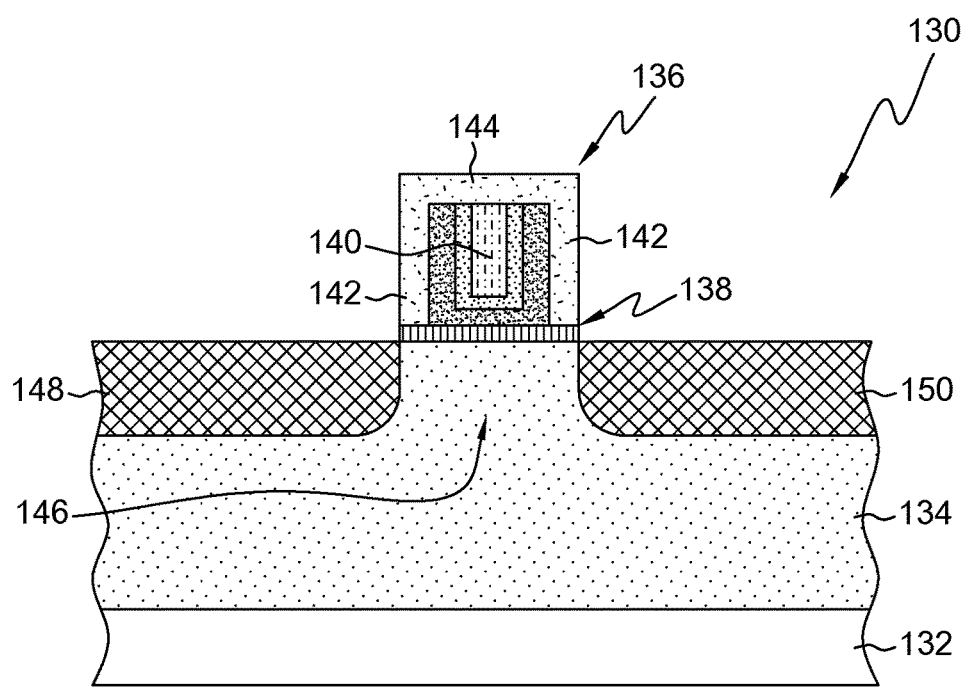
FIG. 4 depicts a cross-sectional view across a fin of one example of a FinFET from the structure of FIG. 3, in accordance with one or more aspects of the present invention.

FIG. 4 depicts a cross-sectional view across a fin of one example of a FinFET 130 from the structure of FIG. 3, in accordance with one or more aspects of the present invention.

The FinFET includes, for example, a semiconductor substrate 132, fin 134, gate structure 136 over dielectric layer 138, the gate structure including a gate electrode 140 with spacers 142 and gate cap 144, and a channel region 146 between source region 148 and drain region 150.

In a first aspect, disclosed above is a method. The method includes providing a semiconductor substrate. The method further includes, in a FinFET fabrication process, forming multiple first fins coupled to the semiconductor substrate having a first fin pitch, and forming multiple second fins coupled to the semiconductor substrate having a second fin pitch larger than the first fin pitch.

In one example, the method of the first aspect may further include, for example, forming transistor(s) on each of the multiple first fins and the multiple second fins, a threshold voltage of the transistor(s) on the multiple second fins being higher than that of the transistor(s) on the multiple first fins.

In one example, the method may further include, for example, in the FinFET fabrication process, exposing active regions of the multiple first fins and the multiple second fins, such that the active regions of the multiple second fins have a more sloped profile than that of the active regions of the multiple first fins, the more sloped profile further increasing the threshold voltage. In one example, exposing the active regions may include, for example, a common etch process.

In a second aspect, disclosed above is a semiconductor structure. The semiconductor structure includes a semiconductor substrate, multiple first fins coupled to the semiconductor substrate having a first fin pitch, and multiple second fins coupled to the semiconductor substrate having a second fin pitch larger than the first fin pitch.

In one example, the semiconductor structure of the second aspect may further include, for example, transistor(s) on the multiple first fins, and transistor(s) on the multiple second fins, a threshold voltage of the transistor(s) on the multiple second fins being higher than that of the transistor(s) on the multiple first fins.

In one example, the semiconductor structure of the second aspect may further include, for example, multiple third fins coupled to the semiconductor structure having a third fin pitch larger than the second fin pitch.

In one example, an active area of the multiple second fins in the semiconductor structure of the second aspect may have for example, a larger slope than that of the multiple first fins.

In one example, the first fin pitch in the semiconductor structure of the second aspect may be, for example, about 25 nm to about 35 nm, and the second fin pitch may be, for example, about 30 nm to about 50 nm.

In one example, the semiconductor structure of the second aspect may further include, for example, multiple third fins coupled to the semiconductor structure having a third fin pitch larger than the second fin pitch, the first fin pitch being about 25 nm to about 35 nm, the second fin pitch being about 30 nm to about 50 nm, and the third fin pitch being about 40 nm to about 60 nm.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor structure, comprising:
   a semiconductor substrate;
   at least two first fins adjacent each other and coupled to the semiconductor substrate, the at least two first fins having a first fin pitch;
   at least two second fins adjacent each other and coupled to the semiconductor substrate, the at least two second fins having a second fin pitch larger than the first fin pitch;
   isolation material in a trench separating the at least two first fins from the at least two second fins and surrounding a bottom portion of the at least two first fins and the at least two second fins, wherein exposed portions of the at least two first fins and the at least two second fins are active; and
   wherein the at least two second fins at the exposed portions thereof each have a single continuous slope extending to a top surface thereof, the single slope being larger than that of the exposed portions of the at least two first fins at a corresponding exposed portion thereof, such that a widest width of the exposed portions of the at least two second fins is at a bottom of the exposed portions thereof.

2. The semiconductor structure of claim 1, further comprising:
   at least one transistor on the at least two first fins; and
   at least one transistor on the at least two second fins;
   wherein a threshold voltage of the at least one transistor on the at least two second fins is higher than that of the at least one transistor on the at least two first fins.

3. The semiconductor structure of claim 1, further comprising at least two third fins coupled to the semiconductor structure having a third fin pitch larger than the second fin pitch.

4. The semiconductor structure of claim 1, wherein the first fin pitch is about 25 nm to about 35 nm, and wherein the second fin pitch is about 30 nm to about 50 nm.

5. The semiconductor structure of claim 1, further comprising at least two third fins coupled to the semiconductor structure having a third fin pitch larger than the second fin pitch, wherein the first fin pitch is about 25 nm to about 35 nm, and wherein the second fin pitch is about 30 nm to about 50 nm, and wherein the third fin pitch is about 40 nm to about 60 nm.

6. The semiconductor structure of claim 1, wherein the slope comprises an upwardly tapered slope.

7. A method, comprising:
   providing a semiconductor substrate;
   in a FinFET fabrication process, forming at least two first fins adjacent each other and coupled to the semiconductor substrate, the at least two first fins having a first fin pitch;
   in the FinFET fabrication process, forming at least two second fins adjacent each other and coupled to the semiconductor substrate, the at least two second fins having a second fin pitch larger than the first fin pitch;
   in the FinFET fabrication process, forming a trench of isolation material between the at least two first fins and the at least two second fins;
   surrounding bottom portions of the at least two first fins and the at least two second fins with isolation material, exposed portions of the at least two first fins and the at least two second fins being active; and
   wherein the at least two second fins at the exposed portions thereof each have a continuous slope extending to a top surface thereof, the single slope being larger than that of the exposed portions of the at least two first fins at a corresponding exposed portion thereof, such that a widest width of the exposed portions of the at least two second fins is at a bottom of the exposed portions thereof.

8. The method of claim 7, further comprising forming at least one transistor on each of the at least two first fins and the at least two second fins, wherein a threshold voltage of the at least one transistor on the at least two second fins is higher than that of the at least one transistor on the at least two first fins.

9. The method of claim 8, wherein exposing the active regions comprises a common etch process.

* * * * *